United States Patent
Cho et al.

(10) Patent No.: US 11,100,867 B2
(45) Date of Patent: Aug. 24, 2021

(54) LIGHT EMITTING DISPLAY APPARATUS

(71) Applicant: LG Display Co., Ltd., Seoul (KR)

(72) Inventors: Youngsung Cho, Paju-si (KR);
Byeong-Seong So, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/710,848

(22) Filed: Dec. 11, 2019

(65) Prior Publication Data

US 2020/0211468 A1 Jul. 2, 2020

(30) Foreign Application Priority Data

Dec. 28, 2018 (KR) .................. 10-2018-0172037

(51) Int. Cl.
*G09G 3/3266* (2016.01)
*G09G 3/3258* (2016.01)
*G09G 3/3291* (2016.01)

(52) U.S. Cl.
CPC ......... *G09G 3/3266* (2013.01); *G09G 3/3258* (2013.01); *G09G 3/3291* (2013.01)

(58) Field of Classification Search
CPC ... G09G 3/3266; G09G 3/3258; G09G 3/3291
See application file for complete search history.

(56) References Cited

U.S. PATENT DOCUMENTS

| 2005/0258466 | A1 | 11/2005 | Kwak et al. |
| 2016/0260792 | A1* | 9/2016 | Kim ............... H01L 27/3276 |
| 2018/0130411 | A1 | 5/2018 | Zhou et al. |
| 2018/0342571 | A1* | 11/2018 | Kwon ............. G09G 3/3233 |
| 2018/0357962 | A1 | 12/2018 | Feng |

FOREIGN PATENT DOCUMENTS

EP 3451321 A1 3/2019

OTHER PUBLICATIONS

European Patent Office, Extended European Search Report and Opinion, EP Patent Application No. 19217510.7, dated Apr. 17, 2020, eight pages.
European Patent Office, Office Action, EP Patent Application No. 19217510.7, dated Dec. 14, 2020, seven pages.
European Patent Office, Office Action, EP Patent Application No. 19217510.7, dated May 18, 2021, ten pages.

* cited by examiner

*Primary Examiner* — Patrick N Edouard
*Assistant Examiner* — Eboni N Giles
(74) *Attorney, Agent, or Firm* — Fenwick & West LLP

(57) ABSTRACT

Disclosed is a light emitting display apparatus in which two of three scan signals used by a pixel driving circuit provided in one pixel are supplied through two scan lines provided in the pixel and the other remaining signal is supplied through a scan line provided in another pixel adjacent to the pixel.

16 Claims, 15 Drawing Sheets

LIGHT EMITTING DISPLAY APPARATUS

CROSS-REFERENCE TO RELATED APPLICATIONS

This application claims the benefit of the Republic of Korea Patent Application No. 10-2018-0172037 filed Dec. 28, 2018, which is hereby incorporated by reference in its entirety.

BACKGROUND

Field of the Disclosure

The present disclosure relates to a light emitting display apparatus using an internal compensation scheme.

Discussion of the Related Art

When a light emitting display panel is used for a long time, a driving transistor supplying current to a light emitting device may be deteriorated, and deterioration of driving transistor leads to deterioration of image quality.

In order to compensate for the deterioration of driving transistor as described above, a pixel driving circuit for controlling the light emitting device includes a plurality of transistors other than driving transistor.

In particular, in the pixel driving circuit having the plurality of transistors for internal compensation, an operation of sensing a threshold voltage of driving transistor must be performed.

However, as the light emitting display apparatus is developed to have a high resolution, a time that may be allocated to the sensing is gradually decreased, resultantly reducing sensing performance of a threshold voltage for internal compensation.

SUMMARY

Accordingly, the present disclosure is directed to providing a light emitting display apparatus that substantially obviate one or more problems due to limitations and disadvantages of the related art.

An aspect of the present disclosure is directed to providing a light emitting display apparatus in which two of three scan signals used by a pixel driving circuit provided in one pixel are supplied through two scan lines provided in the pixel and the other scan signal is supplied through a scan line provided in another pixel adjacent to the pixel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including: pixels each including a light emitting device outputting light and a pixel driving circuit driving the light emitting device, and signal lines connected to the pixel driving circuit. An nth pixel driving circuit driving a light emitting device included in an nth pixel among the pixels uses three scan signals, and two of the three scan signals are provided through two scan lines provided in the nth pixel driving circuit, and the remaining one scan signal is supplied through a scan line provided in an (n+1)th pixel adjacent to the nth pixel, n being an integer greater than or equal to 2.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
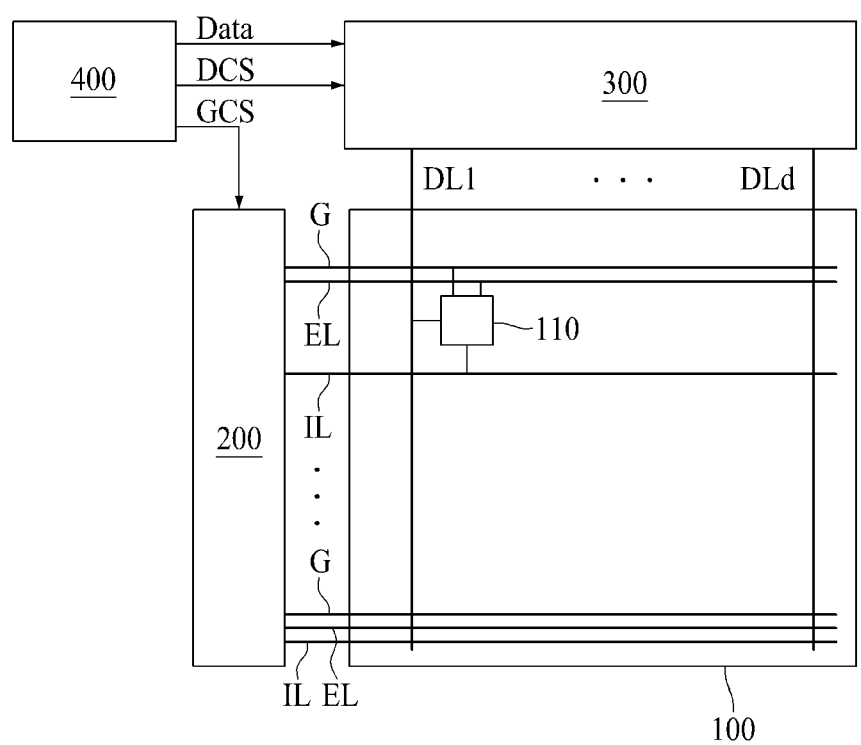
FIG. 1 is a diagram schematically showing a configuration of a light emitting display apparatus according to the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
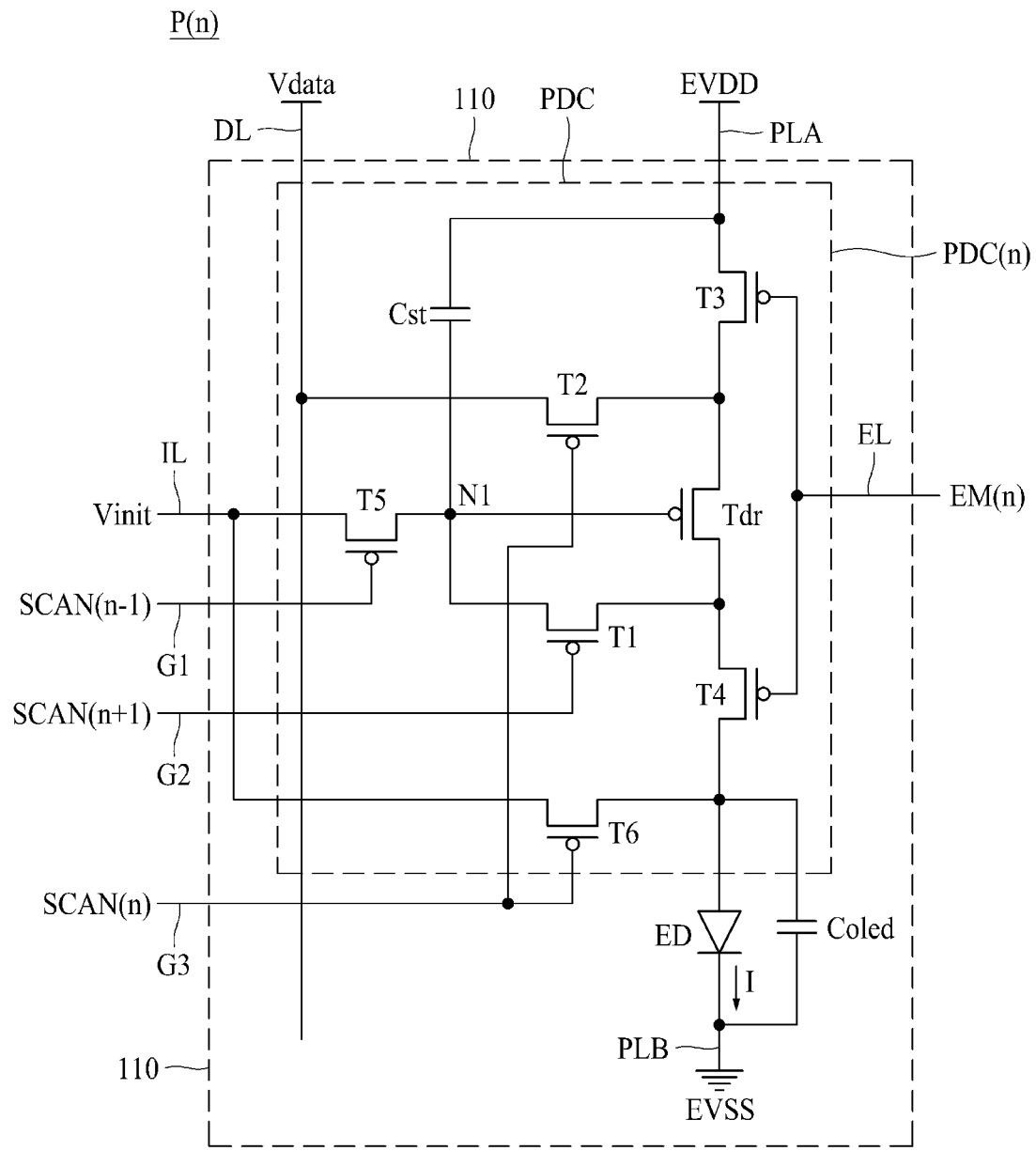
FIG. 2 is a view showing a configuration of a pixel applied to a light emitting display apparatus according to the present disclosure.

FIG. 1 is a view schematically showing a configuration of a light emitting display apparatus according to the present disclosure, and FIG. 2 is a view showing a configuration of a pixel applied to the light emitting display apparatus according to the present disclosure. Although P-type transistors are shown in FIG. 2, the light emitting display apparatus according to the present disclosure is not limited to the P-type transistors. FIG. 2 also shows an nth pixel driving circuit PDC(n) and a light emitting device ED provided in the nth pixel P(n) among the pixels 110 applied to the present disclosure, and n being an integer greater than or equal to 2.

As illustrated in FIGS. 1 and 2, the light emitting display apparatus according to the present disclosure includes pixels 110 including a light emitting device outputting light and a pixel driving circuit PDC driving the light emitting device ED and a driver supplying data voltages Vdata to signal lines connected to the pixel driving circuit PDC and data lines DL1 to DLd connected to the pixels 110 and supplying scan signals to the scan lines G connected to the pixels 110. G illustrated in FIG. 1 denotes the scan lines. The signal lines include the data lines DL1 to DLd and the scan line G.

A driver may include a data driver 300 supplying data voltages Vdata to the pixel driving circuits PDC provided in the pixels 110 through the data lines DL1 to DLd, a gate driver 200 supplying scan signals to the scan lines G and supplying an emission signal EM(n) to an emission line EL, and a controller 400 controlling driving of the data driver 300 and the gate driver 200. In addition, the light emitting display apparatus may include a power supply unit supplying necessary power to the components.

In the present disclosure, an nth pixel driving circuit PDC(n) driving the light emitting device ED provided in an nth pixel P(n), among the pixels 110, use three scan signals SCAN(n−1), SCAN(n+1), and SCAN(n).

In this case, two scan signals SCAN(n−1), SCAN(n+1), among the three scan signals SCAN(n−1), SCAN(n+1), SCAN(n), are supplied through two scan lines G1 and G2 provided in the nth pixel P(n), and the other scan signal SCAN(n) is supplied through a scan line G3 included in the (n+1)th pixel.

Hereinafter, the above-described components will be sequentially described.

First, the pixels 110 and the signal lines are provided in a light emitting display panel 100.

As illustrated in FIGS. 1 and 2, the light emitting display panel 100 includes the pixels 110, the data lines DL1 to DLd, and the scan lines G1, G2, and G3, initialization lines IL to which an initialization voltage is supplied, emission lines EL, first driving voltage lines PLA, and second driving voltage lines PLB.

The scan lines G1, G2, and G3 may be formed in a first direction, for example, a widthwise direction, of the light emitting display panel 100.

Scan signals are supplied from the gate driver 200 to the pixel driving circuits PDC through the scan lines G1, G2, and G3.

In the nth pixel P(n), a (n−1)th scan signal SCAN(n−1) is applied to the first scan line G1, among the scan lines G1, G2, and G3, a (n+1)th scan signal SCAN(n+1) is supplied to the second scan line G2, and an nth scan signal SCAN(n) is supplied to the third scan line G3.

The data lines DL are formed to be parallel to each other at predetermined intervals in a second direction, e.g., a lengthwise direction, of the organic light emitting display panel 100 to intersect the first scan line G1, the second scan line G2, the third scan line G3, the initialization line IL, and the emission line EL. A data voltage Vdata is supplied to the data lines DL.

The first driving voltage lines PLA are formed to be parallel to the data lines DL in the second direction and are spaced apart from the data lines DL at regular intervals. The first driving voltage lines PLA are connected to the power supply unit and supply first driving voltages EVDD supplied from the power supply unit to the pixels 110.

The second driving voltage lines PLB supply a second driving voltage EVSS supplied from the power supply unit to the pixels 110.

The emission lines EL extend in the first direction and supply an emission signal EM for controlling light emission timing of the light emitting device ED to the pixels 110.

The initialization lines IL extend in the first direction and supply initialization voltages Vinit to the pixels 110. The initialization voltage Vinit may be supplied from the power supply unit or the gate driver 200 to the initialization lines IL.

Each of the pixels 110 includes the light emitting device ED and the pixel driving circuit PDC.

The pixel driving circuit PDC includes a driving transistor Tdr and a storage capacitor Cst for controlling the amount of current supplied to the light emitting device ED. In addition to driving transistor Tdr and the storage capacitor Cst, the pixel driving circuit PDC includes first to sixth transistors T1 to T6 and a light emitting device capacitor Coled.

That is, the pixel driving circuit PDC includes driving transistor Tdr having a first terminal, a second terminal, and a gate, a first transistor T1 having a gate connected to the second scan line G2, a first terminal connected to driving transistor Tdr, and a second terminal connected to the second terminal of driving transistor Tdr, a second transistor T2 having a gate connected to the third scan line G3, a first terminal connected to the data line DL, and a second terminal connected to the first terminal of driving transistor Tdr, a third transistor T3 having a first terminal connected to the first driving voltage line PLA, a second terminal connected to the first terminal of driving transistor Tdr, and a gate connected to the emission line EL, a fourth transistor T4 having a first terminal connected to the second terminal of driving transistor Tdr, a second terminal connected to the light emitting device ED, and a gate connected to the emission line EL, a fifth transistor T5 having a gate connected to the first scan line G1, a first terminal connected to the initialization line IL, and a second terminal connected to the gate of driving transistor Tdr, a sixth transistor T6 having a gate connected to the third scan line G3, a first terminal connected to the initialization line IL, and a second terminal connected to the second terminal of the fourth transistor T4 and the light emitting device ED, and a storage capacitor Cst connected to the first terminal of the third transistor T3 and the gate of driving transistor Tdr. The gate of driving transistor Tdr is referred to as a first node N1. A first terminal and a second terminal of the light emitting device capacitor Coled may be connected to the first terminal and the second terminal of the light emitting device ED.

In this case, the first terminal of the light emitting device ED is connected to the second terminal of the fourth transistor T4 and the second terminal of the sixth transistor T6, and the second terminal thereof is connected to the second driving voltage line PLB.

One end of the storage capacitor Cst is connected to the first terminal of the third transistor T3 and the other end of the storage capacitor Cst is connected to the gate of driving transistor Tdr, i.e., a node N1, a second terminal of the fifth transistor T5, and a first terminal of the first transistor T1.

The storage capacitor Cst may charge the data voltage Vdata supplied through the data line DL and a threshold voltage of driving transistor Tdr.

Driving transistor Tdr is turned on by the data voltage Vdata stored in the storage capacitor Cst and controls the amount of current flowing from the first driving voltage line PLA to the light emitting device ED according to the data voltage Vdata.

The light emitting device ED emits light by a current I supplied from driving transistor Tdr and emits light having a luminance corresponding to the current I.

The third transistor T3 and the fourth transistor T4 are turned on by the emission signal EM transmitted through the emission line EL to control a light emission timing of the light emitting device ED.

The light emitting device capacitor Coled may serve to constantly maintain a voltage applied to the light emitting device ED.

The fifth transistor T5 supplies the initialization voltage Vinit to the first node N1.

The sixth transistor T6 supplies the initialization voltage Vinit to the light emitting device ED.

The first to sixth transistors T1 to T6 and the storage capacitor Cst perform a function of compensating for a change in a threshold voltage of driving transistor Tdr.

A method of compensating for the change in the threshold voltage of driving transistor Tdr by the first to sixth transistors T1 to T6 and the storage capacitor Cst will be described below with reference to FIGS. 1 to 15.

A detailed arrangement and form of the first to third scan lines G1, G2, and G3 and the emission line EL will be described in detail below with reference to FIGS. 1 to 9.

The light emitting device ED includes a first electrode, a light emitting layer provided on the first electrode, and a second electrode provided on the light emitting layer. The light emitting layer may include any one of a blue light emitting portion, a green light emitting portion, and a red light emitting portion for emitting light having a color corresponding to a color set in the pixel 110. The light emitting layer may include any one of an organic light emitting layer, an inorganic light emitting layer, or a quantum dot light emitting layer, or may include a stacked or mixed structure of the organic light emitting layer (or the inorganic light emitting layer) and the quantum dot light emitting layer.

Second, the gate driver 200 supplies a gate-on signal to the first to third scan lines G1, G2, and G3 using the gate control signals GCS transmitted from the controller 400.

Here, the gate-on signal refers to a signal capable of turning on the transistors connected to the first to third scan lines G1, G2 and G3. A signal capable of turning off the transistors is called a gate-off signal. The gate-on signal and the gate-off signal are collectively referred to as a scan signal.

A scan signal supplied to the first scan line G1 is referred to as a first scan signal, a scan signal supplied to the second scan line G2 is referred to as a second scan signal, and a scan signal supplied to the scan electrode G3 is referred to as a third scan signal.

Also, the gate driver 200 supplies the emission signals EM to the emission lines EL. The emission signal EM includes a gate-on signal capable of turning on the third transistor T3 and the fourth transistor T4 and a gate-off signal capable of turning off the third transistor T3 and the fourth transistor T4.

The gate driver 200 may be formed independently of the organic light emitting display panel 100 and may be connected to the organic light emitting display panel 100 through a tape carrier package TCP, a chip on film COF or a flexible printed circuit board (FPCB). However, the gate driver 200 may be directly formed on an outer portion of the organic light emitting display panel 100 through a manufacturing process of the pixel driving circuits PDCs using a gate in panel (GIP) scheme.

Third, the power supply unit supplies power to the gate driver 200, the data driver 300, and the controller 400. In particular, the power supply unit may supply the initialization voltages Vinit to the initialization lines IL.

Fourth, the controller 400 generates a gate control signal GCS for controlling driving of the gate driver 200 and a data control signal DCS for controlling driving the data driver 300 using a timing synchronization signal input from an external system. Further, the controller converts input image data input from the external system into image data Data and transmits the image data Data to the data driver 300.

In order to perform the functions as described above, the controller 400 may include a data aligning unit re-aligning input image data transmitted from the external system using the timing synchronization signal transmitted from the external system and supplying the re-aligned image data to the data driver 300, a control signal generating unit generating the gate control signal GCS and the data control signal DCS using the timing synchronization signal, an input unit distributing the timing synchronization signal transmitted from the external system and the input image data to the data aligning unit and the control signal generating unit, and an output unit outputting the image data generated by the data aligning unit and the control signals DCS and GCS generated by the control signal generating unit to the data driver 300 or the gate driver 200.

Fifth, the data driver 300 converts the image data Data transmitted from the controller 400 into data voltages, and supplies the data voltages to the data lines DL1 to DLd.

FIGS. 3 to 8 illustrate a method of manufacturing a light emitting display panel applied to a light emitting display apparatus according to an embodiment of the present disclosure.

First, a multi-buffer is formed on a base substrate.

The base substrate may be formed by stacking polyimide (PI), silicon oxide (SiO₂), and polyimide (PI). In addition, the base substrate may be formed of glass.

The multi-buffer may include at least one of a buffer formed of silicon nitride (SiNx) and a buffer formed of silicon oxide (SiO₂).

For example, the buffer formed of silicon oxide (SiO₂) may be deposited on top of the buffer formed of silicon nitride (SiNx) to form the multi-buffer. Further, silicon oxide (SiO₂) may be deposited on top of the buffer formed of silicon nitride (SiNx) to form the multi-buffer.

Figure 3:
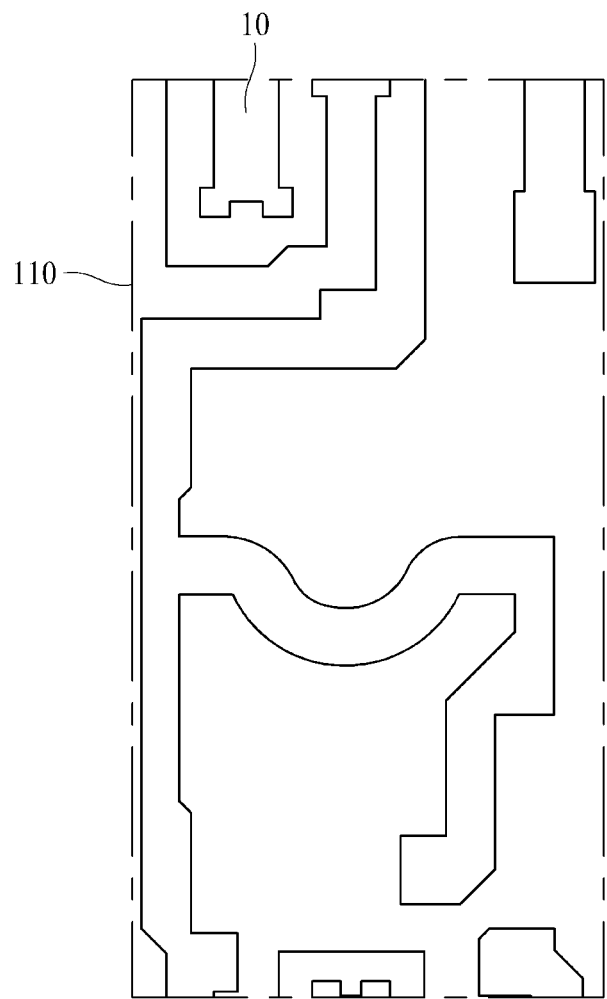
FIGS. 3 to 8 are views illustrating a method of manufacturing a light emitting display panel applied to a light emitting display apparatus according to the present disclosure.

Next, semiconductor patterns 10 may be formed on top of the multi-buffer in such a form as shown in FIG. 3. For example, the semiconductor pattern may be formed of amorphous silicon (a-Si), polysilicon, and an oxide semiconductor.

Next, the semiconductor pattern 10 and the entire surface of the multi-buffer are covered with a gate insulating layer. The gate insulating layer may be formed of silicon oxide (SiO₂).

Figure 4:
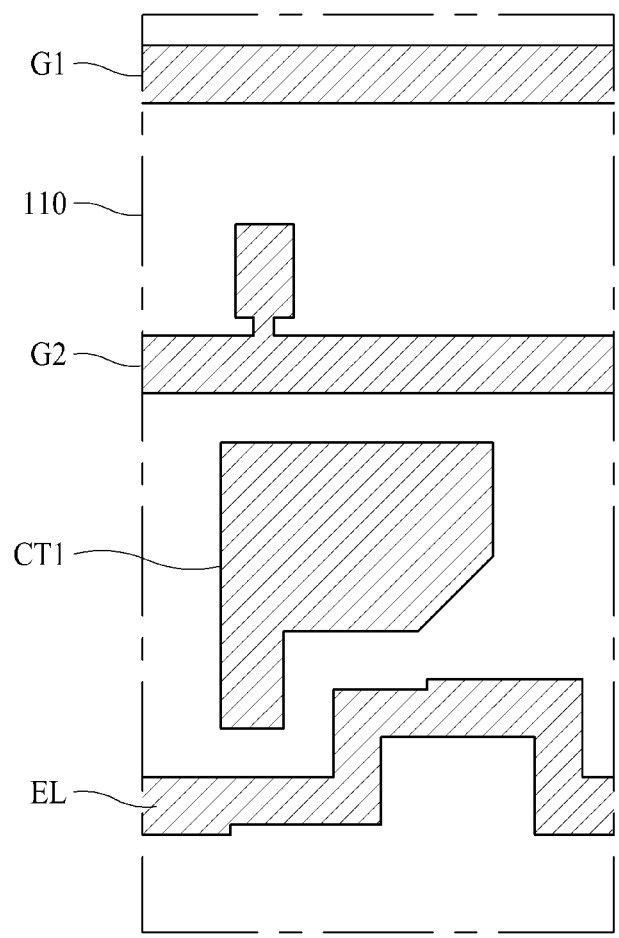

Next, first metal patterns are formed on top of the gate insulating layer in such a form as shown in FIG. 4. The first metal patterns may be formed of a metal such as molybdenum (Mo), for example.

The first metal pattern disposed at the top of one of one pixel 110, among the first metal patterns, is used as the first scan line G1 and the first metal pattern disposed under the first scan line G1 is used as the second scan line G2, and the first metal pattern disposed below the second scan line G2 is used as the emission line EL.

That is, the first scan line G1, the second scan line G2, and the emission line EL are formed through the same process using the same material, and therefore, the first scan line G1, the second scan line G2, and the emission line EL are provided in the same layer.

In this case, the first scan line G1, the second scan line G2, and the emission line EL extend to all the pixels arranged in the first direction of the organic light emitting display panel 100.

Among the first metal patterns, the first metal pattern disposed between the second scan line G2 and the emission line EL forms any one terminal CT1 of the storage capacitor Cst. The first metal pattern forming any one terminal CT1 of the storage capacitor Cst is independently provided in each pixel 110 as shown in FIG. 4.

Next, the first metal patterns and the entire surface of the gate insulating layer are covered with the first insulating layer. The first insulating layer may be formed of silicon nitride (SiNx).

Figure 5:
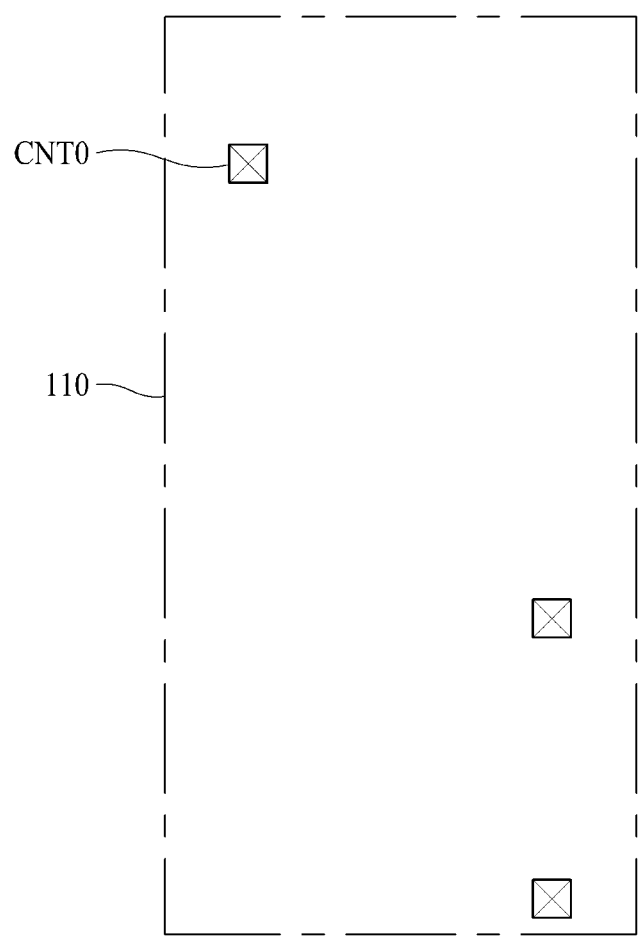

Next, first contact holes CNTO are formed on the first insulating layer as shown in FIG. 5.

Figure 6:
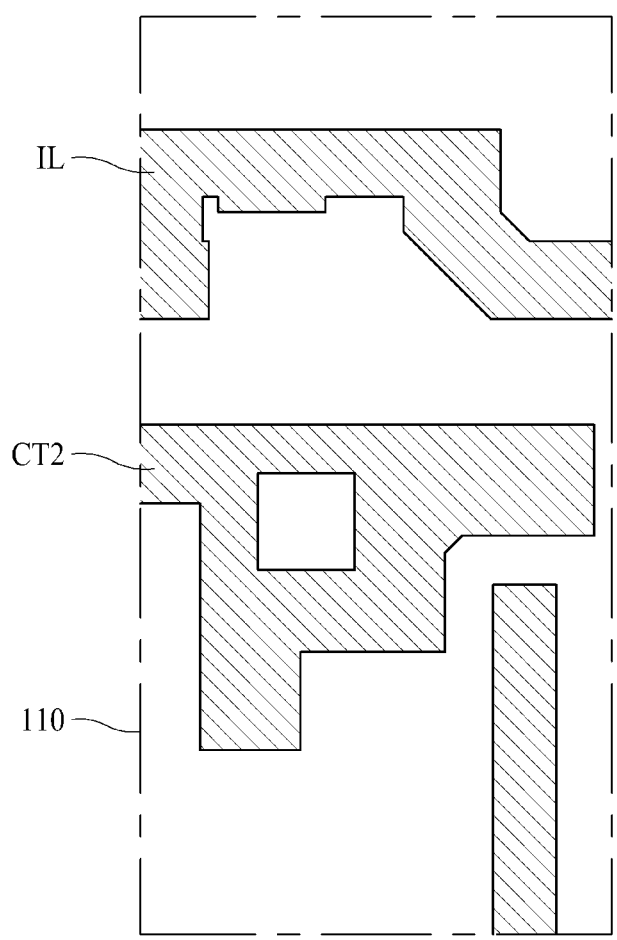

Next, second metal patterns are formed on the first insulating layer in such a form as shown in FIG. 6. The second metal patterns may be formed of, for example, a metal such as molybdenum (Mo).

Among the second metal patterns, the second metal pattern extending in the first direction may be used as the initialization line IL. In addition, the second metal pattern provided under the initialization line IL forms another terminal CT2 of the storage capacitor Cst. The second metal pattern forming another terminal CT2 of the storage capacitor Cst is independently provided at each pixel 110 as shown in FIG. 6.

Next, the second metal patterns and the entire surface of the first insulating layer are covered with a second insulating layer. The second insulating layer may be formed of silicon nitride (SiNx) or silicon oxide (SiO₂).

Figure 7:
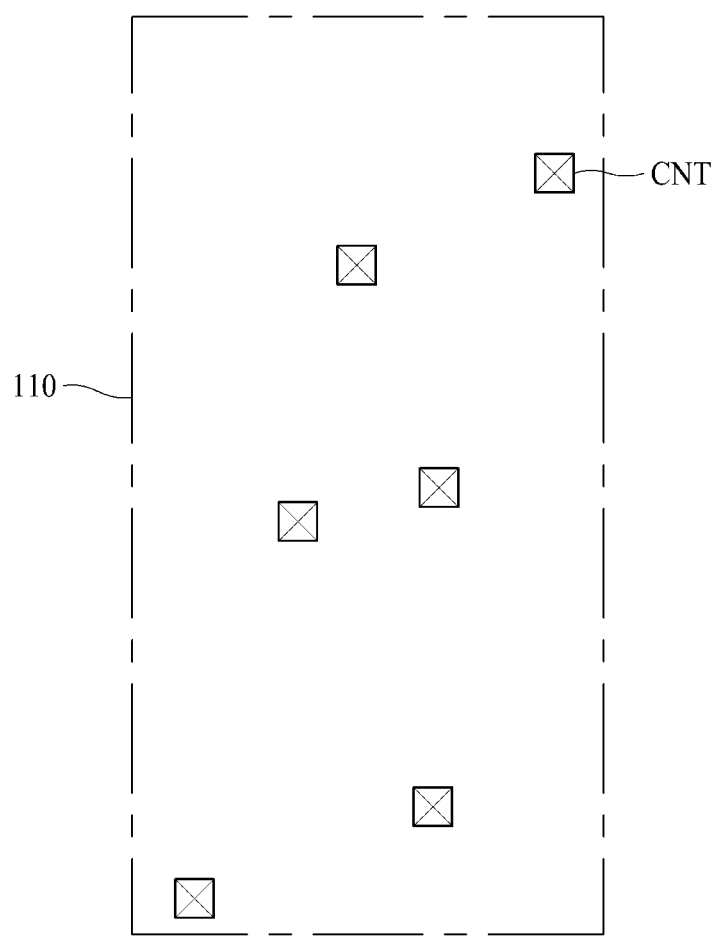

Next, second contact holes CNTs are formed on top of the second insulating layer in the form as shown in FIG. 7.

Figure 8:
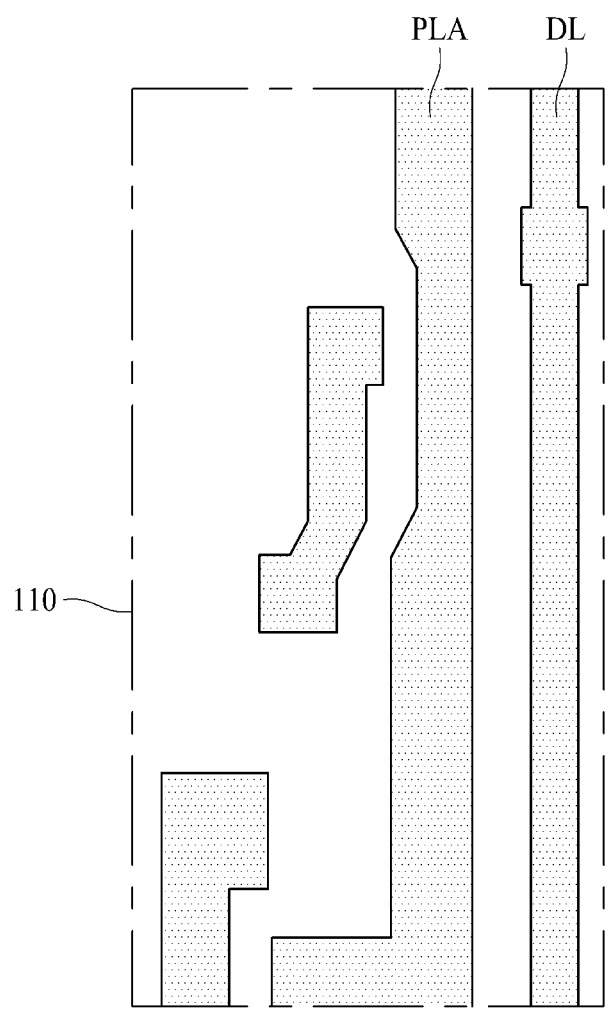

Next, third metal patterns are formed on top of the second insulating layer in such a form as shown in FIG. 8. The third metal patterns may be formed of at least one of titanium (Ti) and aluminum (Al), for example.

Any one of the third metal patterns is used as the data line DL and another third metal pattern is used as the first driving voltage line PLA.

In addition, among the third metal patterns, the third metal patterns other than the third metal patterns configuring the data line DL and the first driving voltage line PLA may electrically connect the first metal patterns to each other, electrically connect the second metal patterns to each other, or electrically connect the first metal patterns and the second metal patterns to each other.

That is, the data line DL and the first driving voltage line PLA are formed through the same process using the same material, and therefore, they are provided in the same layer.

Also, since the data line DL and the first driving voltage line PLA are provided on top of the second insulating layer covering the initialization line IL, the first driving voltage line PLA and the data line DL are provided in a layer different from the initialization line IL.

Since the initialization line IL is provided on top of the first insulating layer covering the first scan line G1, the second scan line G2, and the emission line EL, the initialization line IL is provided on a different layer from the first scan line G1, the second scan line G2 and the emission line EL.

Therefore, the first driving voltage line PLA and the data line DL are provided on a layer different from the initialization line IL, the first scan line G1, the second scan line G2, and the emission line EL.

In this case, the third metal patterns forming the data line DL and the first driving voltage line PLA extend to all the pixels 110 arranged in the second direction.

Among the third metal patterns, the third metal patterns other than the third metal patterns forming the data line DL and the first driving voltage line PLA are present in an independent form in one pixel 110 and serve to electrically connect the metal patterns to each other as described above.

In addition, the third metal patterns may perform the functions of the first terminal and the second terminal of the transistors.

Finally, the third metal patterns and entire surface of the second insulating layer are covered with a passivation layer, various metal layers, an insulating layer, or the like, for completing the pixel driving circuit PDC are formed on top of the passivation layer, and the light emitting device ED may be provided. Accordingly, the organic light emitting display panel according to the present disclosure may be manufactured.

Here, the process after the third metal patterns are formed is the same as or similar to those of the method of manufacturing a current general organic light emitting display panel and is not a feature of the present disclosure. Therefore, a detailed description of the process after the third metal patterns are formed is omitted.

Figure 9:
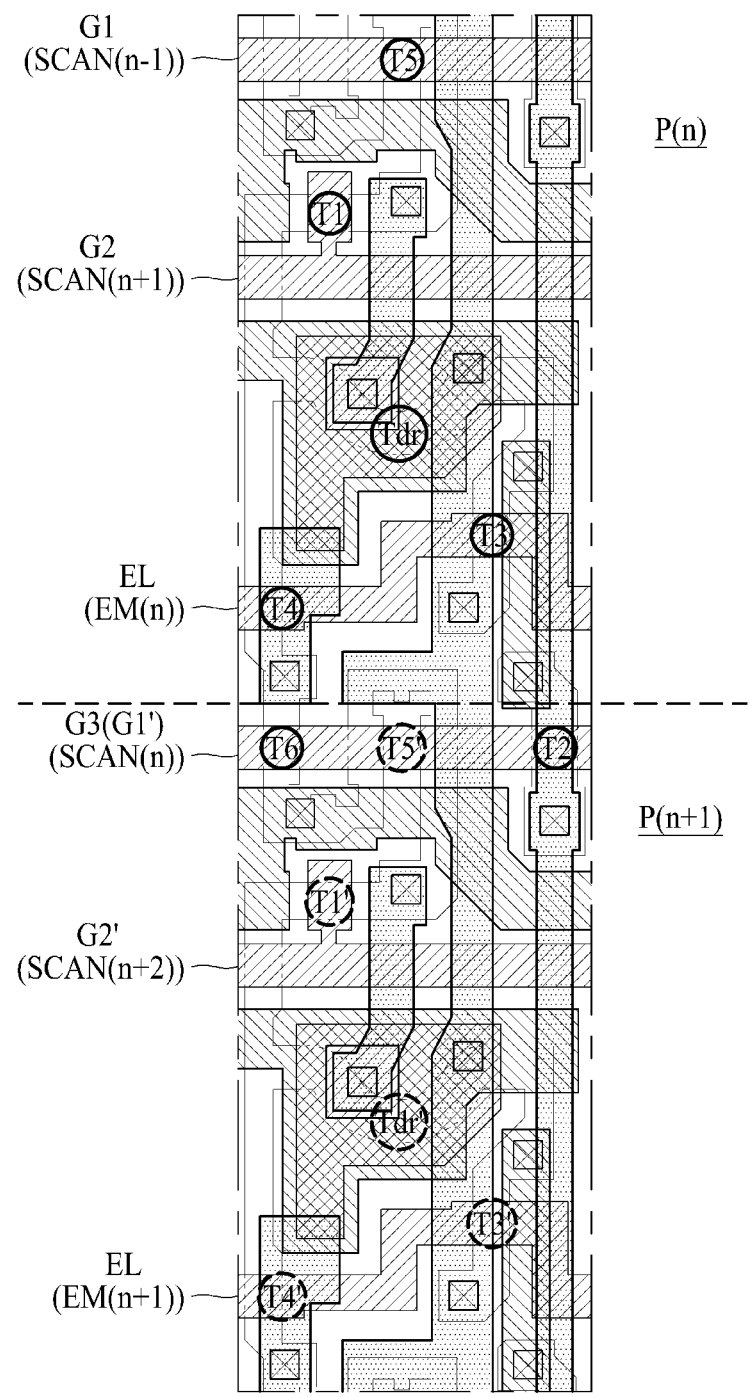
FIG. 9 is a plan view of an embodiment of an organic light emitting display panel according to the present disclosure.

FIG. 9 is a plan view of an organic light emitting display panel according to an embodiment of the present disclosure. In particular, FIG. 9 is a plan view illustrating all the components manufactured through FIGS. 3 to 8. FIG. 9 shows an nth pixel P(n) and an (n+1)th pixel P(n+1) manufactured through the above processes.

As described in the background of the disclosure, in the light emitting display panel of the related art, in order to perform the operation of sensing a threshold voltage during two horizontal periods (period corresponding to twice the period (1 horizontal period) in which the data voltage is supplied to the data lines), three scan signals must be supplied to the pixel driving circuit, and in this case, three scan lines must be provided in one pixel.

However, as the light emitting display apparatuses have been developed to have high resolution, a width of one pixel has been reduced, and thus, it is increasingly difficult to provide three scan lines in one pixel.

In order to solve this problem, in the light emitting display apparatus according to the present disclosure, two of the three scan signals used by the pixel driving circuit PDC included in one pixel 110 are supplied through two scan lines provided in the pixel and the other remaining scan signal is supplied through a scan line included in another pixel adjacent to the pixel 110.

For example, when FIG. 2 shows an nth pixel driving circuit PDC(n) and a light emitting device ED (n) provided in an nth pixel P(n) among the pixels 110 applied to the present disclosure and FIG. 9 shows the nth pixel P(n) and the (n+1)th pixel P(n+1), the nth pixel driving circuit PDC(n) for driving the light emitting device ED included in the nth pixel P(n) among the pixels 110 uses three scan signals, i.e., the first scan signal SCAN(n−1), the second scan signal SCAN(n+1) and the third scan signal SCAN(n).

In this case, two of the three scan signals SCAN(n−1), SCAN(n+1), and SCAN(n), that is, the first scan signal SCAN(n−1) and the second scan signal SCAN(n+1) are supplied through two scan lines, i.e., the first scan line G1 and the second scan line G2, provided in the nth pixel driving circuit PDC(n).

The other remaining one of the three scan signals SCAN(n−1), SCAN(n+1), and SCAN(n) is supplied through the third scan line G3 provided in the (n+1)th pixel P(n+1) adjacent to the nth pixel P(n).

In this case, the nth pixel P(n) and the (n+1)th pixel P(n+1) are adjacent to each other along the data line DL for supplying the data voltage Vdata to the pixels P(n) and P(n+1).

In other words, the three scan signals used in the nth pixel driving circuit PDC(n) are the (n−1)th scan signal SCAN(n−1), nth scan signal SCAN(n), and (n+1)th scan signal SCAN(n+1).

Here, the (n−1)th scan signal SCAN(n−1) is supplied through the first scan line G1 provided in the nth pixel driving circuit PDC(n) of the nth pixel P(n), the (n+1)th scan signal SCAN(n+1) is supplied through the second scan line G2 provided in the nth pixel driving circuit PDC(n) of the nth pixel P(n), and the nth scan signal SCAN(n) is supplied through the third scan signal G3 provided in the (n+1)th pixel driving circuit of the (n+1)th pixel P(n+1).

In this case, the emission line EL provided in the nth pixel driving circuit PDC(n) of the nth pixel P(n) and supplying the emission signal EM to the emission transistors T3 and T4 controlling light emission timing of the light emitting device ED is provided in a boundary portion of the nth pixel P(n) and the (n+1)th pixel P(n+1).

The second scan line G2 to which the (n+1)th scan signal SCAN(n+1) is supplied is further spaced apart from the boundary portion than the emission line EL.

The first scan line G1 supplied with the (n−1)th scan signal SCAN(n−1) is further spaced apart from the boundary portion than the second scan line G2.

The driving transistor Tdr is provided between the second scan line G2 and the emission line EL.

At least one of the transistors configuring the nth pixel driving circuit PDC(n) is provided in the (n+1)th pixel P(n+1).

That is, at least one of the transistors configuring the nth pixel driving circuit PDC(n) is driven by the nth scan signal SCAN(n) supplied through the third scan line G3 included in the (n+1)th pixel P(n+1).

For example, the transistors driven by the scan line, i.e., the third scan line G3, configuring the nth pixel driving circuit PDC(n) and provided in the (n+1)th pixel P(n+1) are the second transistor T2 and the sixth transistor T6 as shown in FIG. 9.

In addition to the second transistor T2 and the sixth transistor T6 configuring the nth pixel driving circuit PDC (n), a fifth transistor T5' configuring the (n+1)th pixel driving circuit provided in the (n+1)th pixel P(n+1) may be connected to the third scan line G3. That is, two transistors T2 and T6 of the nth pixel P(n) and one transistor T5' of the (n+1)th pixel P(n+1) may be connected to the third scan line G3.

In this case, in the (n+1)th pixel P(n+1), the scan line supplied with the nth scan signal SCAN(n) is the first scan line G1', the scan line supplied with the (n+2)th scan signal SCAN(n+2) is the second scan line G2', and the scan line supplied with the (n+1)th scan signal SCAN(n+1) is the third scan line. The (n+1)th scan signal to be used in the (n+1)th pixel P(n+1) is provided in the (n+2)th pixel.

Among the transistors configuring the (n+1)th pixel driving circuit applied to the (n+1)th pixel P(n+1), the third transistor T3', the first transistor T1', the fourth transistor T4', the fifth transistor T5', and the driving transistor Tdr' are provided in the (n+1)th pixel P(n+1), and the second transistor and the sixth transistor are provided in the (n+2)th pixel.

Hereinafter, a method of driving a light emitting display apparatus according to the present disclosure will be described with reference to FIGS. 1 to 15. In the following description, the same or similar contents as those described with reference to FIGS. 1 to 9 are omitted or briefly described.

Figure 10:
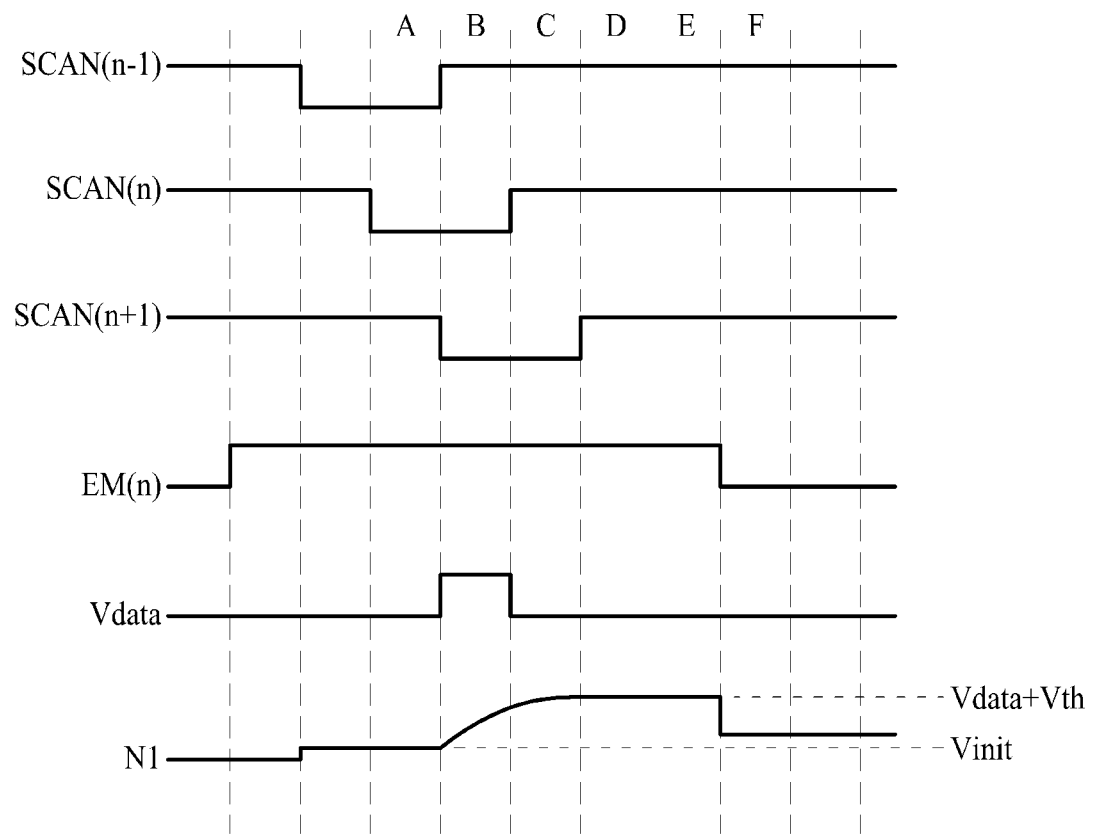
FIG. 10 is a view illustrating waveforms of signals applied to an organic light emitting display apparatus according to the present disclosure.

FIG. 10 is a view illustrating waveforms of signals applied to an organic light emitting display apparatus according to the present disclosure, and FIGS. 11 to 15 are views illustrating a method of driving a light emitting display apparatus according to the present disclosure.

First, as illustrated in FIG. 10, during a first period A, the first scan signal SCAN(n−1) having a low level is supplied to the fifth transistor T5, the second scan signal SCAN(n+1) having a high level is supplied to the first transistor T1, the third scan signal SCAN(n) having a low level is supplied to the second transistor T2 and the sixth transistor T6, and the emission signal EM having a high level is supplied to the third transistor T3 and the fourth transistor T4.

Figure 11:
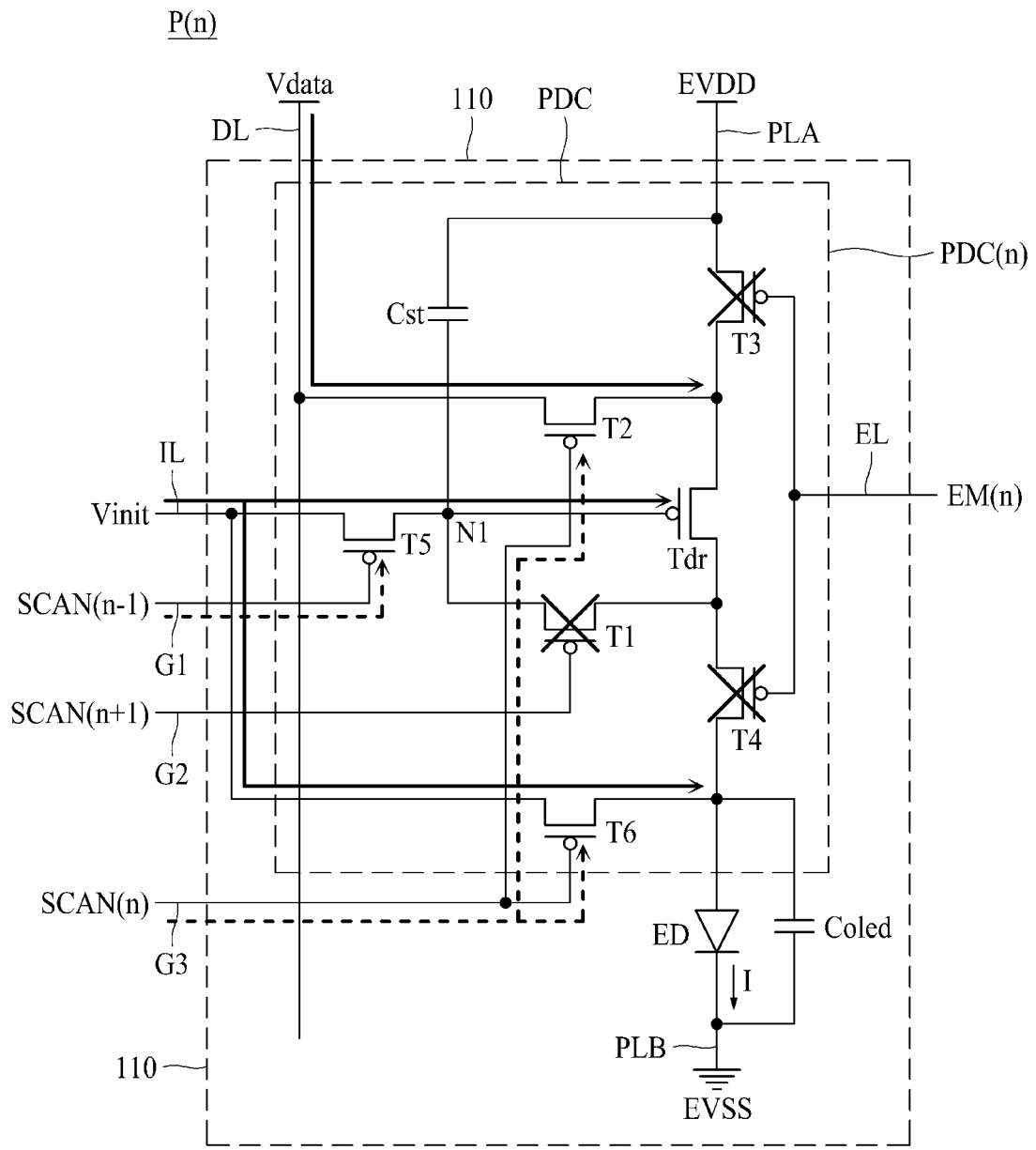
FIGS. 11 to 15 are views illustrating a method of driving a light emitting display apparatus according to an embodiment of the present disclosure.

Therefore, as shown in FIG. 11, the fifth transistor T5, the second transistor T2, and the sixth transistor T6 are turned on, and the first transistor T1, the third transistor T3, and the fourth transistor T4 are all turned off.

In this case, the first node N1 connected to the gate of driving transistor Tdr is initialized by the initialization voltage. That is, a voltage of the first node N1 is the initialization voltage.

Since the initialization voltage Vinit is also transferred to the light emitting device ED through the sixth transistor T6, the light emitting device ED is also initialized to the initialization voltage Vinit.

Next, as shown in FIG. 10, during a second period B, the first scan signal SCAN(n−1) having a high level is supplied to the fifth transistor T5, the second scan signal SCAN(n+1) having a low level is supplied to the first transistor T1, the third scan signal SCAN(n) having a low level is supplied to the second transistor T2 and the sixth transistor, and the emission signal EM having a high level is supplied to the third transistor T3 and the fourth transistor T4.

Figure 12:
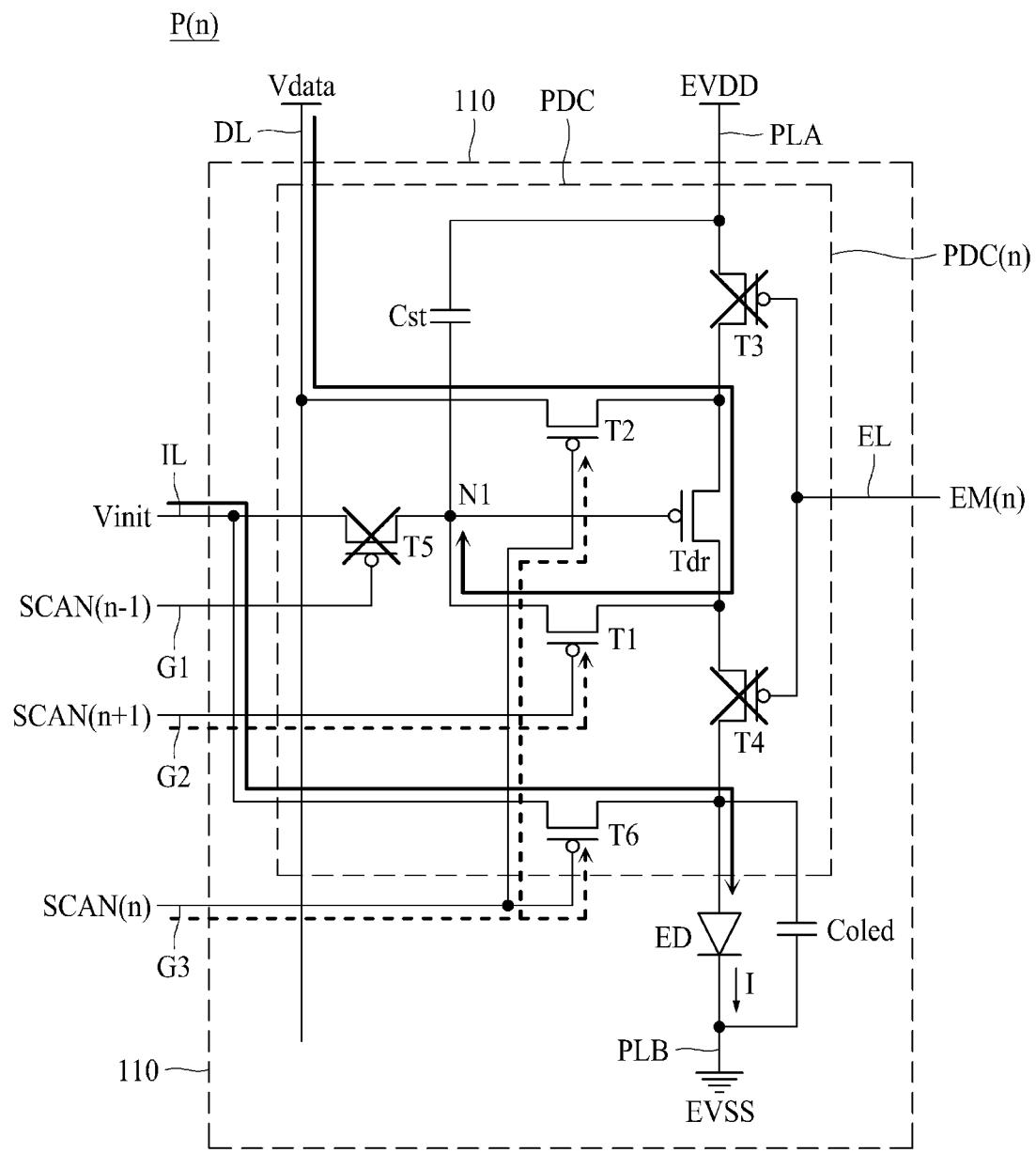

Accordingly, as shown in FIG. 12, the first transistor T1, the second transistor T2, driving transistor Tdr, and the sixth transistor T6 are turned on, and the third to fifth transistors T3 to T5 are all turned off.

In this case, the data voltage Vdata is supplied to the first node N1 through the data line DL, the second transistor T2, driving transistor Tdr, and the first transistor T1.

Accordingly, the data voltage Vdata and a threshold voltage of driving transistor Tdr are supplied to the first node N1. Accordingly, the data voltage Vdata and the threshold voltage are charged in the storage capacitor Cst.

Also, the light emitting device ED is continuously initialized to the initialization voltage Vinit.

Next, as shown in FIG. 10, during a third period C, the first scan signal SCAN(n−1) having a high level is supplied to the fifth transistor T5, the second scan signal SCAN(n+1) having a low level is supplied to the first transistor T1, the third scan signal SCAN(n) having a high level is supplied to the second transistor T2 and the sixth transistor T6, and the emission signal EM having a high level is supplied to the third transistor T3 and the fourth transistor T4.

Figure 13:
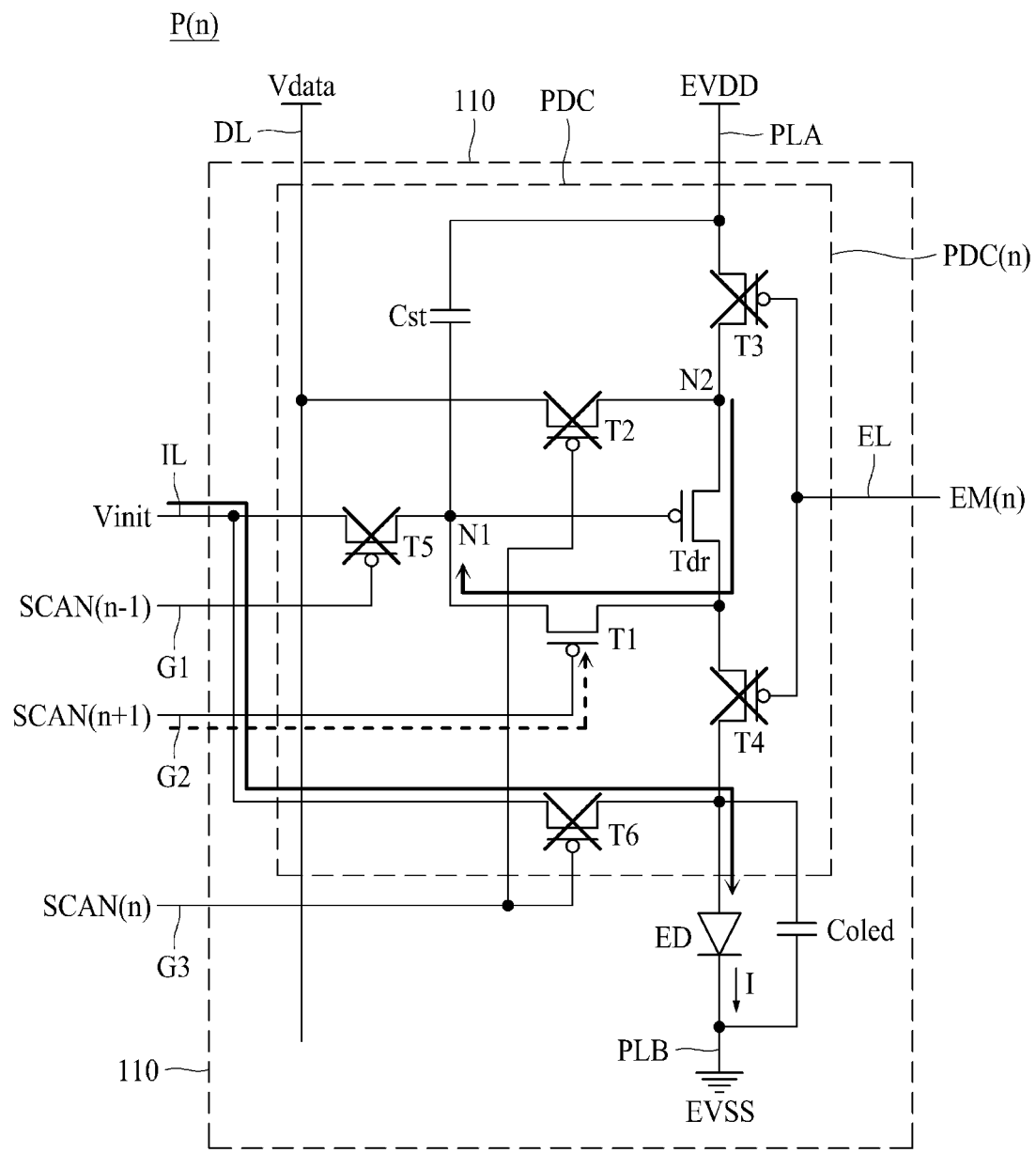

Thus, as shown in FIG. 13, the first transistor T1 is turned on and the second to sixth transistors T2 to T6 are all turned off.

In this case, the data voltage Vdata supplied to the first terminal of driving transistor Tdr, that is, to the second node N2 shown in FIG. 13, during the second period B is not supplied to the second node N2 any longer because the second transistor T2 is turned off during the third period C. In this case, the driving transistor Tdr may be turned on by the data voltage supplied to the first node N1 during the second period B, and thus, the data voltage Vdata applied to the first node N1 in a floating state may be supplied to the first node N1 through driving transistor Tdr. In this case, the threshold voltage of driving transistor Tdr may also be applied to the first node N1.

Therefore, the threshold voltage of driving transistor Tdr may be continuously charged in the storage capacitor Cst connected to the first node N1.

That is, in the present disclosure, the threshold voltage of driving transistor Tdr is charged in the storage capacitor Cst during the second period B and the third period C, that is, during two horizontal periods. Accordingly, the threshold voltage of driving transistor Tdr may be sufficiently stored in the storage capacitor Cst, and thus, compensation efficiency of the threshold voltage may be increased.

Next, as shown in FIG. 10, during a fourth period D and a fifth period E, the first scan signal SCAN(n−1) having a high level is supplied to the fifth transistor T5, the second scan signal SCAN(n+1) having a high level is supplied to the first transistor T1, the third scan signal SCAN(n) having a high level is supplied to the second transistor T2 and the sixth transistor T6, and the emission signal EM having a high level is supplied to the third transistor T3 and the fourth transistor T4.

Figure 14:
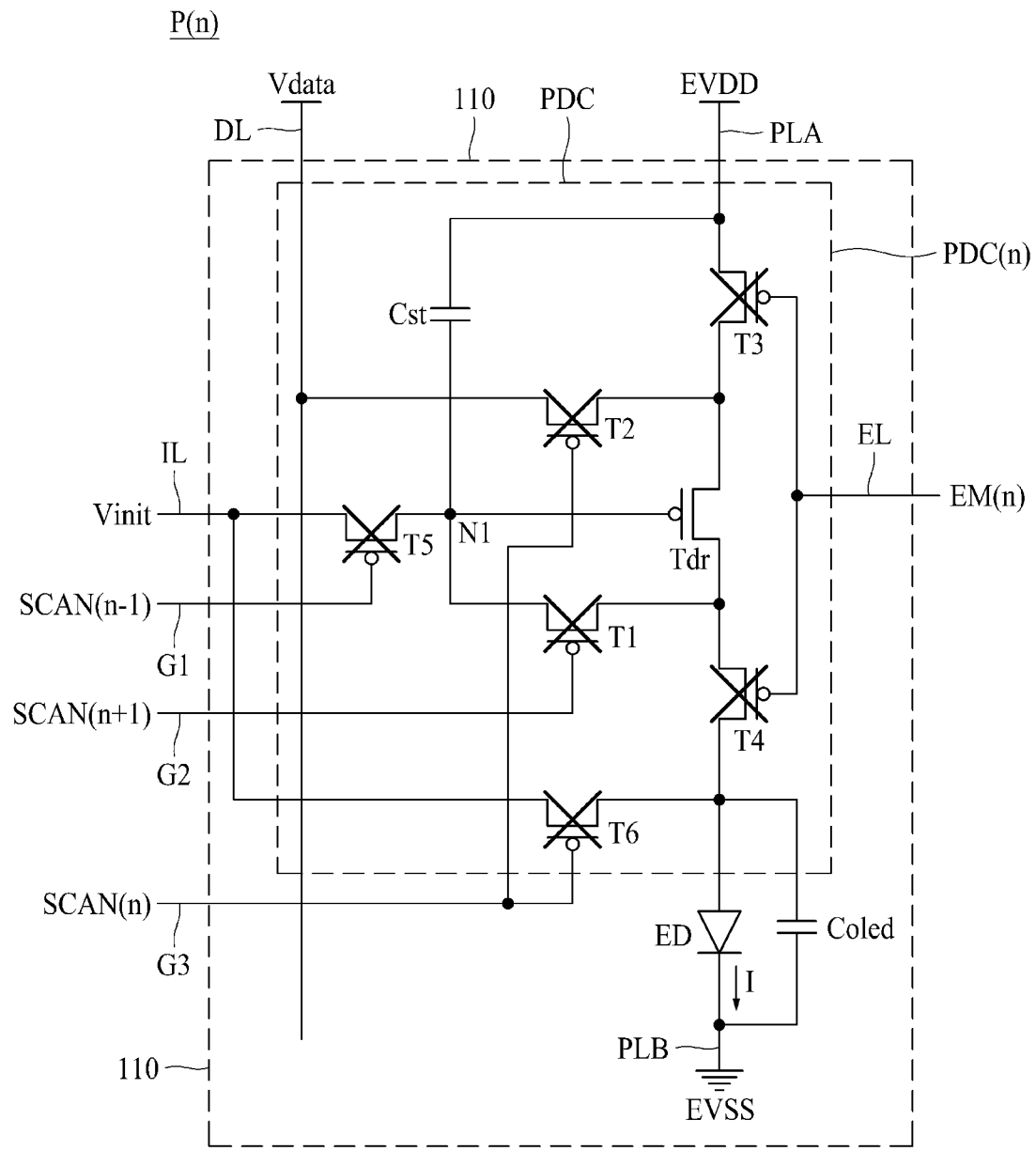

Thus, as shown in FIG. 14, the first to sixth transistors T1 to T6 are all turned off.

In this case, the voltage of the first node N1 is maintained as the sum of the threshold voltage Vth of driving transistor Tdr and the data voltage Vdata. That is, the storage capacitor Cst is charged with the threshold voltage and the data voltage.

Lastly, as shown in FIG. 10, during a sixth period F, the first scan signal SCAN(n−1) having a high level is supplied to the fifth transistor T5, the second signal SCAN(n−1) having a high level is supplied to the first transistor T1, the third scan signal SCAN(n) having a high level is supplied to the second transistor T2 and the sixth transistor, and the emission signal EM having a low level is supplied to the third transistor T3 and the fourth transistor T4.

Figure 15:
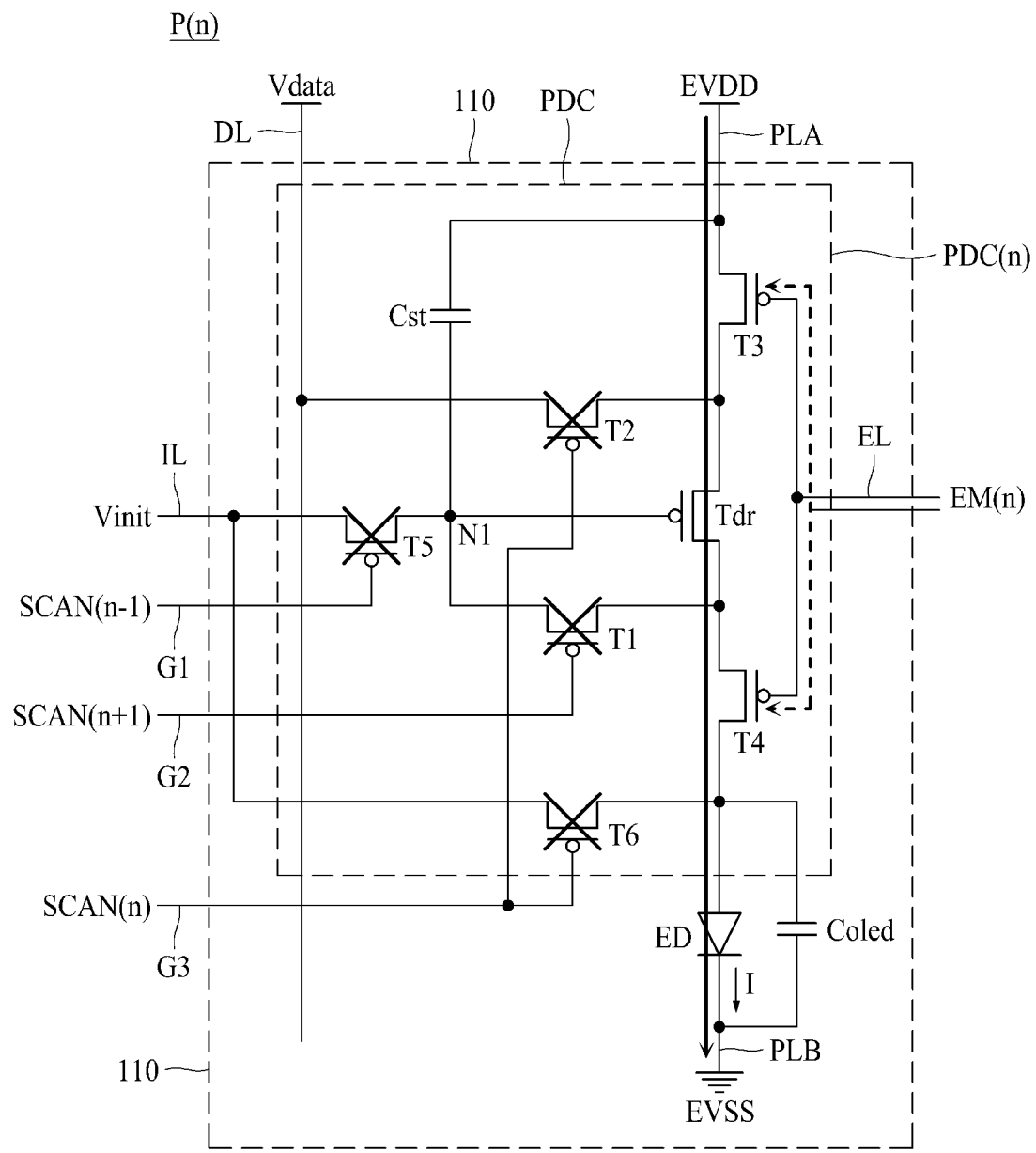

Accordingly, as shown in FIG. 15, the first transistor T1, the second transistor T2, the fifth transistor T5, and the sixth transistor T6 are turned off, and the third transistor T3, the driving transistor Tdr, and the fourth transistor T4 are all turned on.

Since the data voltage Vdata and the threshold voltage Vth are supplied to the gate of driving transistor Tdr, the driving transistor Tdr is also turned on.

Accordingly, a current may be supplied to the light emitting device ED through the third transistor T3, the driving transistor Tdr, and the fourth transistor T4, and the light emitting device ED may output light having a brightness corresponding to the current.

In this case, the voltage applied to the gate of the driving transistor Tdr is [Vdata+Vth], the voltage applied to the source of the driving transistor Tdr is the first driving voltage EVDD, and the current passing through the driving transistor Tdr is proportional to a voltage obtained by subtracting the threshold voltage Vth of the driving transistor Tdr from a difference voltage (Vgs=Vdata+Vth−EVDD) between the gate and the source of the driving transistor Tdr.

That is, the current I supplied to the light emitting device ED through the driving transistor Tdr may be expressed by Equation 1 below.

$$[I \propto (Vgs-Vth)^2 = (Vdata+Vth-EVDD-Vth))^2 = Vdata-EVDD)^2]$$ Equation [1]

The current supplied to the light emitting device ED through the driving transistor Tdr is determined by the data voltage Vdata and the first driving voltage EVDD and is not determined by the threshold voltage Vth of the driving transistor Tdr.

In general, the driving transistor Tdr may be deteriorated as the organic light emitting display apparatus is used for a long time, and thus, the threshold voltage Vth of the driving transistor Tdr may be changed.

In addition, the degree of deterioration of the driving transistor Tdr included in the pixel 110 formed in the organic light emitting display panel 100 may be varied depending on various reasons.

When the degrees of deterioration of the driving transistors Tdr are different, the threshold voltages of the driving transistors Tdr are also different from each other.

When the threshold voltages of driving transistors Tdr are different from each other, even if the same data voltage Vdata is supplied to the driving transistors Tdr, the magnitudes of the currents supplied to the light emitting devices ED through the driving transistors Tdr may be varied. As a result, the light emitting devices ED included in the pixels supplied with the same data voltage Vdata may output light of different brightness.

In order to solve the above problem, the present disclosure is configured such that the current flowing through driving transistor Tdr is not affected by the threshold voltage Vth of the driving transistor Tdr.

That is, in the present disclosure, by the structure of the pixel as shown in FIG. 2 and the driving method described with reference to FIGS. 10 to 15, the magnitude of the current I passing through the driving transistor Tdr is not affected by the threshold voltage of the driving transistor Tdr as shown in Equation [1].

Therefore, according to the present disclosure, even if the driving transistors Tdr are degraded, a normal current corresponding to the data voltage Vdata may be supplied to the light emitting device ED in each pixel, and accordingly, the light emitting device ED may output light having a brightness proportional to the data voltage Vdata.

In particular, in the present disclosure, two of the three scan lines required for the operation described above are arranged in one pixel, and the other scan line is disposed in another pixel adjacent to the pixel.

Thus, according to the present disclosure, even if the width of a pixel is reduced as the light emitting display apparatus is developed to have high resolution, the pixel driving circuit may accurately detect the threshold voltage of driving transistor during two horizontal periods using three scan signals. Further, in the above description, the storage capacitor Cst is charged with the threshold voltage of driving transistor Tdr during two horizontal periods, that is, the second period B and the third period C, but, if the width of the scan signals is increased to three horizontal periods, the storage capacitor may be charged with the threshold voltage of the driving transistor Tdr during three horizontal periods.

For example, in FIG. 10, if the (n−1)th scan signal SCAN(n−1) is increased by 1 horizontal period in a forward direction of the first period A, the nth scan signal SCAN(n) is also increased by 1 horizontal period in the forward direction of the first period A, and the (n+2)th scan signal having the width of 1 horizontal period in the direction of the fourth period D replaces the (n+1)th scan signal SCAN(n+1) illustrated in FIG. 10, then the storage capacitor may be charged with the threshold voltage of the driving transistor Tdr during a total of three horizontal periods from the second period B to the fourth period D.

That is, in the present disclosure, the period during which the threshold voltage of driving transistor Tdr is charged is not limited to the two horizontal periods but may be increased to three horizontal periods or longer depending on a pulse width of the scan signals and order of the scan signals.

According to the present disclosure, the threshold voltage of the driving transistor may be sensed during two horizontal periods using three scan signals. Accordingly, the threshold voltage may be more accurately sensed when compared with the light emitting display apparatus of the related art.

In addition, according to the present disclosure, in order to sense the threshold voltage of the driving transistor during two horizontal periods, two of the three scanning signals used by the pixel driving circuit provided in one pixel may be supplied through two scan lines provided in the pixel and the other remaining one scan signal may be supplied through a scan line provided in another pixel adjacent to the pixel. Therefore, even if the width of one pixel is reduced as the light emitting display apparatus is developed to have a high resolution, the pixel driving circuit may accurately sense the threshold voltage of the driving transistor during two horizontal periods using three scan signals.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
a plurality of pixels, each pixel including a light emitting device outputting light and a pixel driving circuit driving the light emitting device; and
a plurality of signal lines connected to the pixel driving circuit,
wherein an nth pixel driving circuit driving a light emitting device included in an nth pixel among the plurality of pixels uses three scan signals,
wherein an (n−1)th scan signal is supplied through a first scan line provided in the nth pixel, an (n+1)th scan signal is supplied through a second scan line provided in the nth pixel, and ft an nth scan signal is supplied through a third scan line provided in an (n+1)th pixel adjacent to the nth pixel, n being an integer greater than or equal to 2,
wherein the nth pixel driving circuit comprises:
a driving transistor having a first terminal, a second terminal, and a gate terminal;
a first transistor having a gate terminal connected to the second scan line, a first terminal connected to the gate terminal of the driving transistor, and a second terminal connected to the second terminal of the driving transistor;
a second transistor having a gate terminal connected to the third scan line, a first terminal connected to a data line, and a second terminal connected to the first terminal of the driving transistor;
a third transistor having a gate connected to the first scan line, a first terminal connected to an initialization line, and a second terminal connected to the gate terminal of the driving transistor at a first node; and
a fourth transistor having a gate terminal connected to the third scan line, a first terminal connected to the initialization line, and a second terminal connected to the light emitting device; and
wherein the light emitting display device is configured such that:

during a first period, the first node connected to the gate terminal of the driving transistor controlling a magnitude of a current flowing to the light emitting device is initialized by an initialization voltage supplied via the initialization line responsive to the (n−1)th scan signal being at a first voltage level that turns on the third transistor, and the light emitting device is also initialized to the initialization voltage responsive to the nth scan signal being at the first voltage level that turns on the fourth transistor, wherein the (n+1)th scan signal is at a second voltage level that turns off the first transistor during the first period, during a second period, a storage capacitor connected to the first node is charged with a data voltage and a threshold voltage of the driving transistor responsive to the (n+1)th scan signal being at the first voltage level that turns on the first transistor, and the light emitting device is continuously initialized to the initialization voltage responsive to the nth scan signal being at the first voltage level that turns on the fourth transistor, wherein the (n−1)th scan signal is at the second voltage level that turns off the third transistor during the second period, during a third period, the storage capacitor is charged with the data voltage and the threshold voltage of the driving transistor responsive to the (n+1)th scan signal being at the first voltage level that turns on the first transistor, and a light emitting device capacitor constantly maintains the voltage applied to the light emitting device, wherein the (n−1)th scan signal is at the second voltage level that turns off the third transistor during the third period, and the nth scan signal is at the second voltage level that turns off the second transistor and the fourth transistor during the third period, during fourth and fifth periods, a voltage of the storage capacitor is maintained as a sum of the data voltage and the threshold voltage, and the light emitting device capacitor constantly maintains the voltage applied to the light emitting device, responsive to the (n−1)th scan signal, the nth scan signal, and the (n+1)th scan signal being at the second voltage level that respectively turns off the third transistor, the fourth transistor, and the first transistor during the fourth and fifth periods, and during a sixth period, a current corresponding to the data voltage is supplied to the light emitting device through the driving transistor, responsive to the (n−1)th scan signal, the nth scan signal, and the (n+1)th scan signal being at the second voltage level that respectively turns off the third transistor, the fourth transistor, and the first transistor during the sixth period.

2. The light emitting display apparatus of claim 1, wherein the nth pixel and the (n+1)th pixel are adjacent along data lines supplying data voltages to the pixels.

3. The light emitting display apparatus of claim 1, wherein an emission line provided in the nth pixel driving circuit and supplying an emission signal to a fifth transistor or a sixth transistor controlling a light emission timing of the light emitting device is provided in a boundary portion of the nth pixel and the (n+1)th pixel among the plurality of pixels, the second scan line supplied with the (n+1)th scan signal is spaced apart from the boundary portion further than the emission line, the first scan line supplied with the (n−1)th scan signal is spaced apart from the boundary portion further than the second scan line, and a driving transistor is provided between the second scan line and the emission line.

4. The light emitting display apparatus of claim 3, wherein at least one transistor configuring the nth pixel driving circuit is provided in the (n+1)th pixel.

5. The light emitting display apparatus of claim 1, wherein the nth pixel driving circuit further comprises:
a fifth transistor having a first terminal connected to a first driving voltage line, a second terminal connected to the first terminal of the driving transistor, and a gate connected to an emission line;
a sixth transistor having a first terminal connected to the second terminal of the driving transistor, a second terminal connected to the light emitting device and the second terminal of the fourth transistor, and a gate connected to the emission line,
wherein the storage capacitor is connected to the first terminal of the fifth transistor and the first node.

6. The light emitting display apparatus of claim 5, wherein the second transistor and the fourth transistor are provided in the (n+1)th pixel and connected to the third scan line provided in the (n+1)th pixel, and
the driving transistor, the first transistor, the third transistor, the sixth transistor, and the fifth transistor are provided in the nth pixel.

7. A light emitting display apparatus comprising:
a plurality of pixels, each pixel including:
a light emitting device configured to output light;
a light emitting device capacitor having terminals connected with terminals of the light emitting device; and
a pixel driving circuit configured to drive the light emitting device, the light emitting display apparatus further comprising:
signal lines connected to the pixel driving circuit,
wherein an nth pixel driving circuit is configured to drive a corresponding light emitting device included in an nth pixel among the plurality of pixels, the nth pixel driving circuit configured to use first, second and third scan signals, and
first and second scan lines provided in the nth pixel are configured to supply the first and second scan signals, and a third scan line provided in an (n+1)th pixel adjacent to the nth pixel is configured to supply the third scan signal, n being an integer greater than or equal to 2,
wherein the light emitting display device is configured such that:
during a first period, a first node connected to a gate of a driving transistor controlling a magnitude of a current flowing to the light emitting device is initialized by an initialization voltage supplied by an initialization line and the light emitting device is also initialized to the initialization voltage supplied by the initialization line,
during a second period, a data voltage is supplied to the first node via the driving transistor, a storage capacitor connected to the first node is charged with a data voltage and a threshold voltage of the driving transistor, and the light emitting device is continuously initialized to the initialization voltage supplied by the initialization line,
during a third period, the data voltage supply to the driving transistor is stopped, the storage capacitor is further charged with the data voltage and the threshold voltage of the driving transistor, and a light emitting device capacitor constantly maintains the voltage applied to the light emitting device, during a fourth period, a voltage of the storage capacitor is maintained as the sum of the data voltage and the threshold voltage, and the light emitting device capacitor constantly maintains the voltage applied to the light emitting device, and during a fifth period, a current corresponding to the data voltage is supplied to the light emitting device through the driving transistor.

8. The light emitting display apparatus of claim 7, wherein the nth pixel driving circuit comprises a plurality of transistors, one of the plurality of transistors being provided in the (n+1)th pixel, and wherein the third scan line is configured to drive the one of the plurality of transistors.

9. The light emitting display apparatus of claim 7, wherein the nth pixel and the (n+1)th pixel are each positioned on a single data line, the data line configured to supply a data voltage to each of the nth and (n+1)th pixels.

10. The light emitting display apparatus of claim 7, wherein
the first scan signal is an (n−1)th scan signal, the second scan signal is an (n+1)th scan signal, and the third scan signal is an nth scan signal.

11. The light emitting display apparatus of claim 10, wherein
the (n−1)th scan signal is supplied through the first scan line, the (n+1)th scan signal is supplied through the second scan line, and the nth scan signal is supplied through the third scan line.

12. The light emitting display apparatus of claim 7, wherein
an emission line provided in the nth pixel driving circuit and supplying an emission signal to an emission transistor configured to control a light emission timing of the light emitting device corresponding to the nth pixel driving circuit, is provided in a boundary portion of the nth pixel and the (n+1) pixel, wherein the second scan line is further spaced apart from the boundary portion than the emission line, the first scan line is further spaced apart from the boundary portion than the second scan line, and a driving transistor is provided between the second scan line and the emission line.

13. The light emitting display apparatus of claim 7, wherein
the nth pixel driving circuit comprises a plurality of transistors and at least one of the plurality of transistors is provided in the (n+1)th pixel.

14. The light emitting display apparatus of claim 7, wherein
the nth pixel driving circuit comprises a plurality of transistors and the third scan line is configured to drive at least one of the plurality of transistors.

15. The light emitting display apparatus of claim 7, wherein
the nth pixel driving circuit comprises:
a driving transistor having a first terminal, a second terminal, and a gate;
a first transistor having a gate connected to a second scan line, a first terminal connected to the gate of the driving transistor, and a second terminal connected to the second terminal of the driving transistor;
a second transistor having a gate connected to a third scan line, a first terminal connected to a data line, and a second terminal connected to the first terminal of the driving transistor;
a third transistor having a first terminal connected to a first driving voltage line, a second terminal connected to the first terminal of the driving transistor, and a gate connected to an emission line;
a fourth transistor having a first terminal connected to the second terminal of the driving transistor, a second terminal connected to the light emitting device, and a gate connected to the emission line;
a fifth transistor having a gate connected to a first scan line, a first terminal connected to an initialization line, and a second terminal connected to the gate of the driving transistor;
a sixth transistor having a gate connected to the third scan line, a first terminal connected to the initialization line, and a second terminal connected to the second terminal of the fourth transistor and the light emitting device; and
a storage capacitor connected to the first terminal of the third transistor and the gate of the driving transistor.

16. The light emitting display apparatus of claim 15, wherein
the second transistor and the sixth transistor are provided in the (n+1)th pixel, and connected to the third scan line provide in the (n+1)th pixel, and
the driving transistor, the first transistor, the third transistor, the fourth transistor and the fifth transistor are provided in the nth pixel.

* * * * *